(12) United States Patent
Shih et al.

(10) Patent No.: US 10,007,174 B2
(45) Date of Patent: Jun. 26, 2018

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Chih-Tsung Shih, Hsinchu (TW); Shinn-Sheng Yu, Hsinchu (TW); Jeng-Horng Chen, Hsin-Chu (TW); Anthony Yen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 99 days.

(21) Appl. No.: 15/092,889

(22) Filed: Apr. 7, 2016

(65) Prior Publication Data

US 2016/0223899 A1    Aug. 4, 2016

Related U.S. Application Data

(63) Continuation of application No. 14/052,506, filed on Oct. 11, 2013, now Pat. No. 9,316,900.

(51) Int. Cl.
  *G03F 1/22*  (2012.01)
  *G03F 1/24*  (2012.01)
  *G03F 7/20*  (2006.01)

(52) U.S. Cl.
  CPC .............. *G03F 1/24* (2013.01); *G03F 7/2004* (2013.01)

(58) Field of Classification Search
  None
  See application file for complete search history.

(56) References Cited

U.S. PATENT DOCUMENTS

| | | | |
|---|---|---|---|
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 2006/0222961 A1 | 10/2006 | Yan | |
| 2006/0281017 A1* | 12/2006 | Kim | B82Y 10/00 430/5 |
| 2013/0202992 A1 | 8/2013 | Chen et al. | |
| 2013/0260288 A1 | 10/2013 | Yu et al. | |
| 2015/0104734 A1 | 4/2015 | Shih et al. | |
| 2015/0286146 A1 | 10/2015 | Chang et al. | |
| 2015/0309405 A1 | 10/2015 | Shih et al. | |
| 2015/0311075 A1 | 10/2015 | Huang et al. | |

* cited by examiner

*Primary Examiner* — Stephen Rosasco
(74) *Attorney, Agent, or Firm* — Haynes and Boone, LLP

(57) ABSTRACT

A mask for extreme ultraviolet lithography (EUVL) is disclosed. The mask includes a low thermal expansion material (LTEM) layer; and a reflective multilayer (ML) above one surface of the LTEM layer, wherein the reflective ML has a first thickness in a first reflective region and a second thickness in a second reflective region, wherein the second thickness is different from the first thickness.

20 Claims, 5 Drawing Sheets

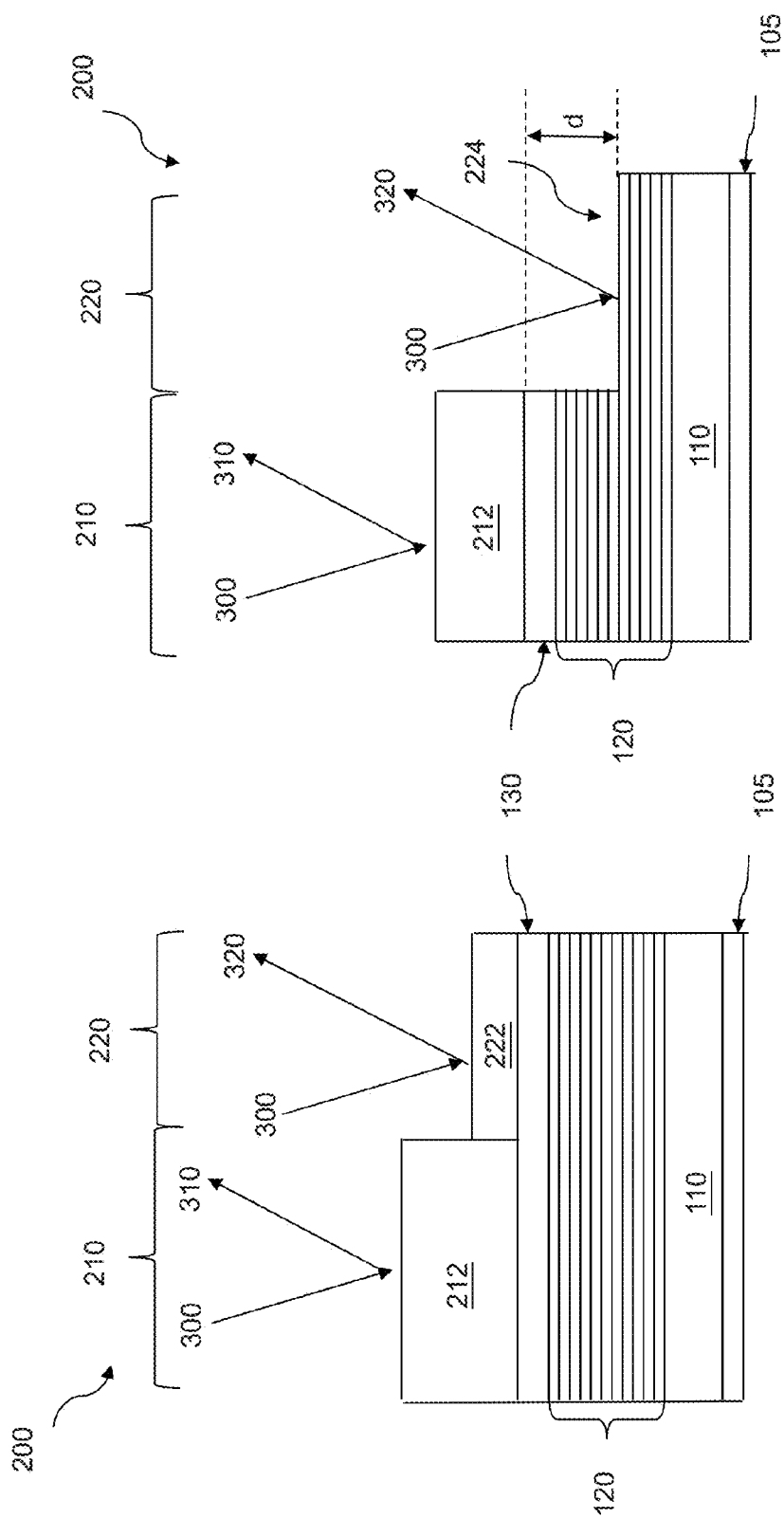

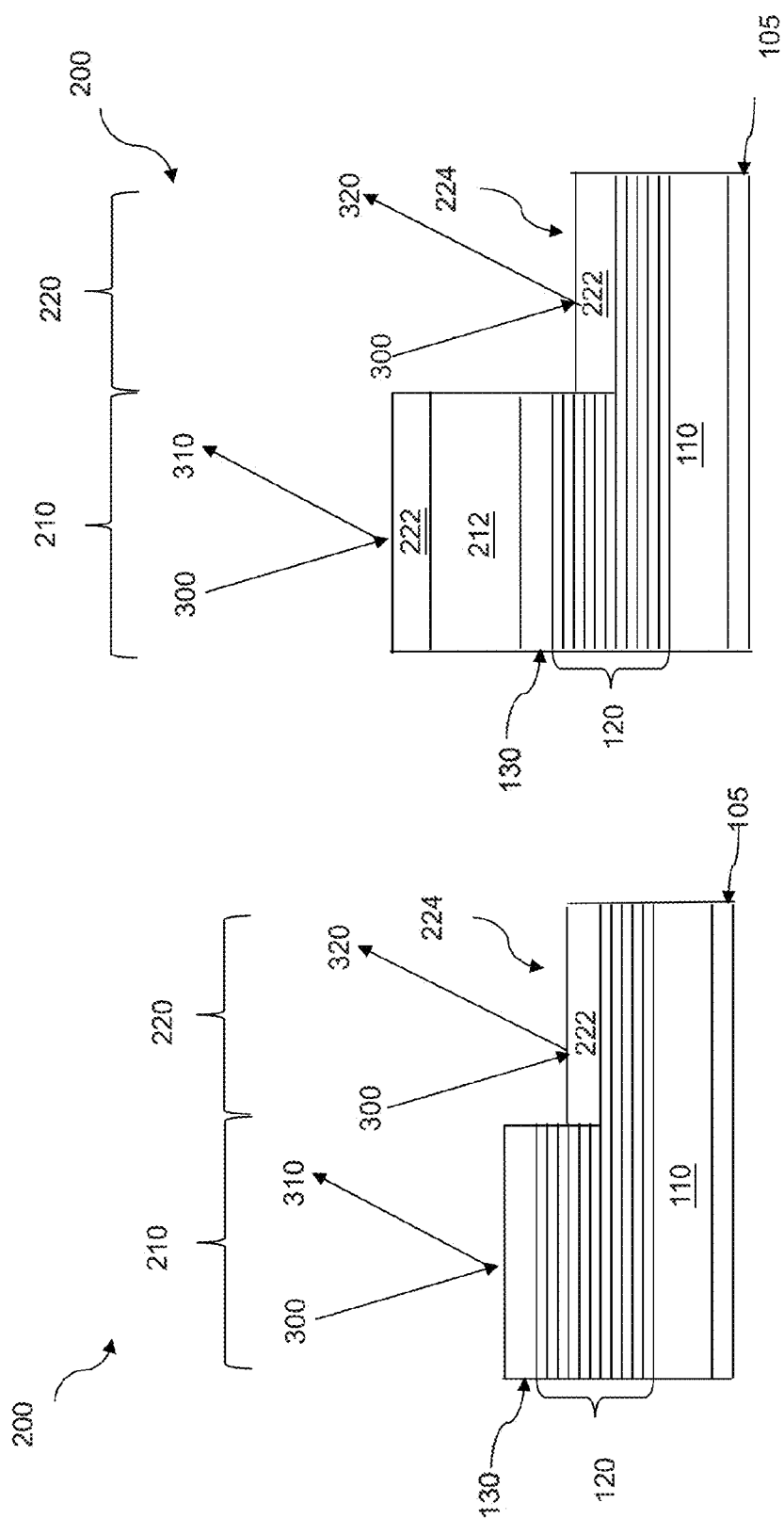

EXTREME ULTRAVIOLET LITHOGRAPHY PROCESS AND MASK

PRIORITY DATE

This application is a continuation application of application Ser. No. 14/052,506, filed Oct. 11, 2013, entitled "An Extreme Ultraviolet Lithography Process and Mask," the entire disclosure of which is incorporated herein by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, challenges rise to obtain high optical contrast. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are diagrammatic cross-sectional views of various aspects of one embodiment of an EUV mask at various stages of a lithography process constructed according to aspects of the present disclosure.

DETAILED DESCRIPTION

Figure 1:
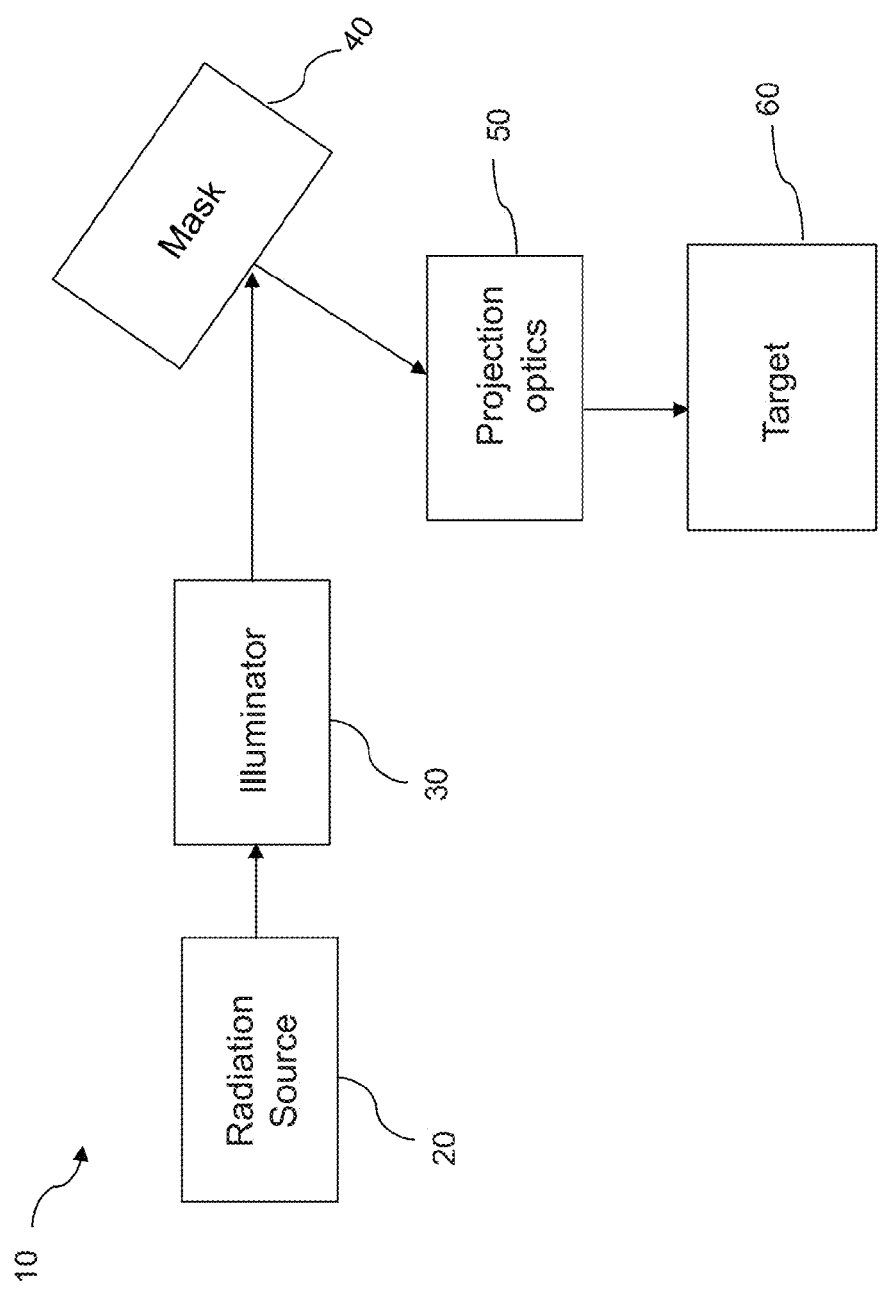
FIG. 1 is a block diagram of a lithography system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The EUV lithography process 10 employs an EUV radiation source 20 having a wavelength of about 1-100 nm, including an EUV wavelength of about 13.5 nm.

The EUV lithography system 10 also employs an illuminator 30. The illuminator 30 may comprise refractive optics, such as a single lens or a lens system having multiple lenses (zone plates) and/or reflective optics, such as a single mirror or a mirror system having multiple mirrors, in order to direct light from the radiation source 20 onto a mask 40. In the EUV wavelength range, reflective optics is generally employed. Refractive optics, however, can also be realized by zoneplates. In the present embodiment, the illuminator 30 is set up to provide an on-axis illumination to illuminate a mask 40. In on-axis illumination, most all incoming light rays incident on the mask are at the same angle of incidence (AOI), e.g., AOI=6°, as that of a chief ray. In many situations, there may be some angular spread of the incident light. For example, the EUV lithography system 10 may utilize disk illumination (i.e., illumination on a pupil plane is shaped like a disk centered at the pupil center). Partial coherence σ can also be used to describe a point source which produces a plane wave for illuminating the mask 40. In the present embodiment, it is sufficient to employ a nearly on-axis illumination having point sources with σ less than 0.3.

The EUV lithography system 10 also employs a mask 40 (the terms mask, photomask, and reticle are used herein to refer to the same item). In the present embodiment, the mask 40 is a reflective mask. The mask 40 may incorporate other resolution enhancement techniques such as phase-shifting mask (PSM) and/or optical proximity correction (OPC).

In general, an incident light ray reflected from a mask diffracts into various diffraction orders due to presence of these mask patterns, such as a 0-th diffraction order ray, a −1-st diffraction order ray and a +1-st diffraction order ray. In the present embodiment, the 0-th diffracted light rays are mostly eliminated due a structure of the mask 40, which will be described in details later. The −1-st and +1-st diffraction order are collected and directed to expose a target. Since the strength of the −1-st and +1-st diffraction order rays are well balanced, they interfere with each other and will generate a high contrast aerial image. As an example, equipped with the mask 40, a high contrast and uniform light intensity across a substrate is achieved, as shown in FIGS. 2A and 2B. FIGS. 2A and 2B graphically illustrate the exposure intensity distribution (vertical scale) across a photoresist layer on a substrate to be exposed (horizontal scale). In FIG. 2B, the unit for the exposing intensity is a relative unit ranging from 0 to 1. In this case, "1" stands for 100% of the exposing intensity from the exposing system before reaching the photoresist layers.

The EUV lithography system 10 also employs optics 50. The optics 50 may have refractive optics or reflective optics. The radiation reflected from the mask 40 (e.g., a patterned radiation) is collected by the optics 50.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process usually includes two steps: a mask substrate fabrication process and a mask patterning process. During the mask substrate fabrication process, a mask substrate is formed by deposing suitable layers (e.g., multiple reflective layers) on a suitable substrate. The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Figure 2:
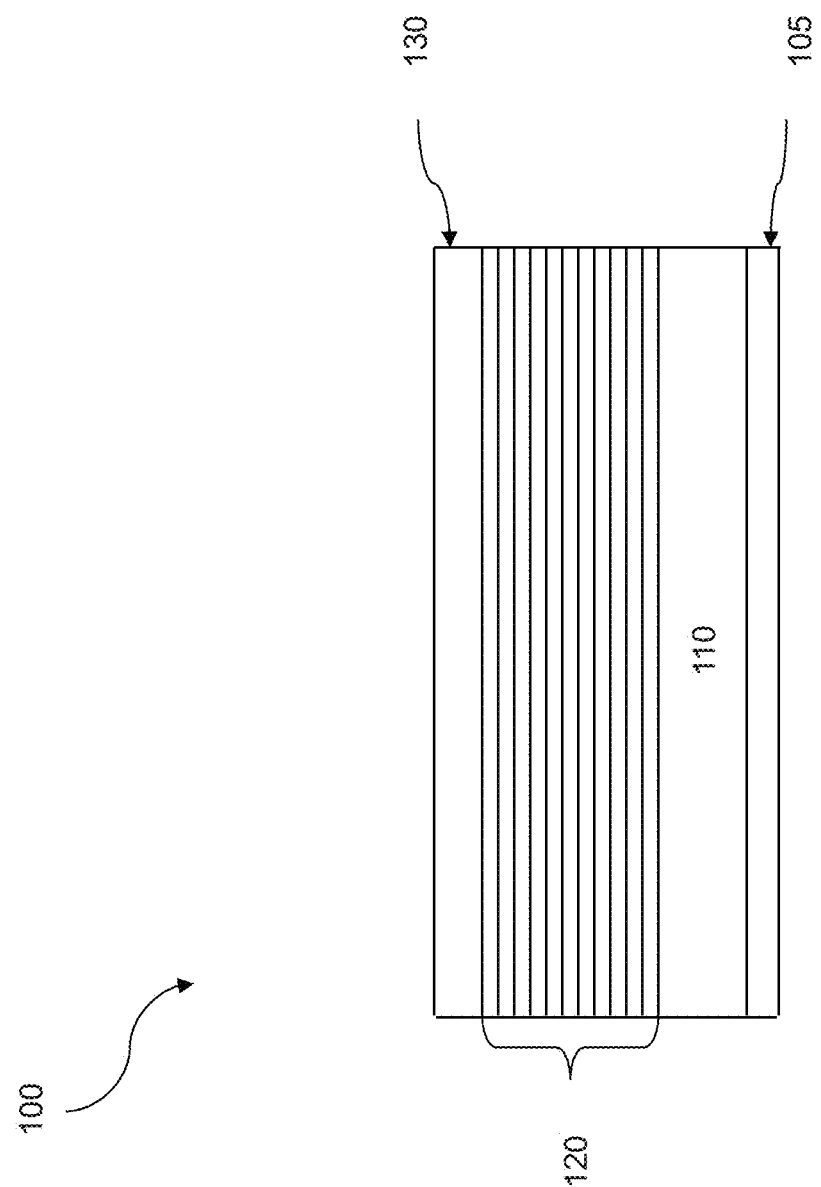
FIG. 2 is a diagrammatic cross-sectional view of various aspects of one embodiment of a mask substrate at various stages of a lithography process constructed according to aspects of the present disclosure.

Referring to FIG. 2, a EUV mask substrate 100 comprises a material layer 110 made of low thermal expansion material (LTEM). The LTEM includes $TiO_2$, doped $SiO_2$, and/or other low thermal expansion materials known in the art. The LTEM layer 110 serves to minimize image distortion due to mask heating. In the present embodiment, the LTEM layer includes materials with a low defect level and a smooth surface. In addition, a conductive layer 105 may be deposed under (as shown in the figure) the LTEM layer 110 for the electrostatic chucking purpose. In an embodiment, the conductive layer 105 includes chromium nitride (CrN), though other compositions are possible.

The EUV mask substrate 100 includes a reflective multilayer (ML) 120 deposed over the LTEM material layer 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let light reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any material that is highly reflective at EUV wavelengths can be utilized for the reflective ML 120. The thickness of each layer of the reflective ML 120 depends on the EUV wavelength and the incident angle. The thickness of the reflective ML 120 is adjusted to achieve a maximum constructive interference of the EUV light reflected at each interface and a minimum absorption of the EUV light by the reflective ML 120. The reflective ML 120 may be selected such that it provides a high reflectivity to a selected radiation type/wavelength. A typical number of film pairs is 20-80, however any number of film pairs is possible. The reflective ML 120 usually achieves a reflectance of 0.65 or above. In an embodiment, the reflective ML 120 includes forty pairs of layers of Mo/Si. Each Mo/Si film pair has a thickness of about 7 nm, with a total thickness of 280 nm. In this case, a reflectivity of about 70% is achieved.

The EUV mask substrate 100 may also include a capping layer 130 disposed above the reflective ML 120 to prevent oxidation of the reflective ML. In one embodiment, the capping layer 130 includes ruthenium (Ru), Ru compounds such as RuB, RuSi, chromium (Cr), Cr oxide, and Cr nitride.

One or more of the layers 105, 120 and 130 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Referring to FIGS. 3A-3D, a first reflective region 210 and a second reflective region 220 are formed over the EUV mask substrate 100 for an EUV mask 200. In the present embodiment, the first reflective region 210 and the second reflective region 220 are configured such that when an incoming light 300 is reflected from the first reflective region 210, referred as to a first reflected light 310 has an about 180 degree phase shift and a substantially equal intensity with respect to a reflected light from the second reflective region 220, referred as to a second reflected light 320 The configuration may be referred to as a $2^{nd}$ order Kinoform grating. Thus, a resultant reflected light constructed by the first reflected light 310 and second reflected light 320 contains almost zero 0-th diffraction order. The resultant reflected light contains mainly −1-st and +1-st diffraction.

In one embodiment, the first reflective region 210 includes a molybdenum (Mo) layer 212 deposited over the capping layer 130, having a thickness of about 42.53 nm. While the second reflective region 220 includes an aluminum (Al) layer 222 deposited over the capping layer 130, having a thickness of about 16 nm, as shown in FIG. 3A. Alternatively, instead of an Al layer, an actinium (Ac) layer 222 is deposited over the capping layer 130, having a thickness of about 6 nm.

In another embodiment, the first reflective region 210 includes a Mo layer 214 deposited over the capping layer 130, having a thickness of about 14.53 nm. While the second reflective region 220 is formed by the ML trench 224 of, having a depth d of 28 nm. The trench 224 is formed by removing the capping layer 130 and a portion of the ML 120 in the second reflected region 220, as shown in FIG. 3B.

In yet another embodiment, the first reflective region 210 is formed by the capping layer 130 disposed over the ML 120 and the ML 120 over the LTEM layer 110. While the second reflective region 220 is formed by an AL layer 222 disposed over the ML trench 224. The Al layer 222 has a thickness of about 16 nm as shown in FIG. 3C. Alternatively, instead of Al layer, an Ac layer 222 is deposited over the ML trench 224, having a thickness of about 6 nm.

In yet another embodiment, the first reflective region 210 includes the Al layer 222 deposited over the Mo layer 212, having a thickness of about 16 nm, and the Mo layer 212 deposited over the capping layer 130, having a thickness of about 32.53 nm. While the second state 220 includes the Al layer 222 deposited over the ML trench 224, as shown in FIG. 3D. In one embodiment, the Al layer 222 is formed simultaneously over the first and second reflective regions, 210 and 220, by local deposition process, such as a gas-assisted focused-electron-beam-induced deposition. Alternatively, instead of Al layer, an actinium (Ac) layer 222 is deposited over the Mo layer 212 in the first reflective region 210 and over the ML trench 224 in the second reflective region 220, having a thickness of about 6 nm.

Figure 4A:
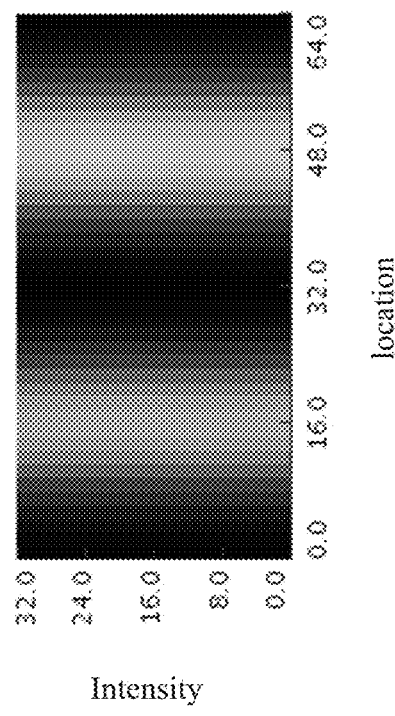
FIGS. 4A and 4B are diagrammatical views of various exposing intensity profiles during a lithography exposure process according to one or more embodiments of the present disclosure.
Figure 4B:
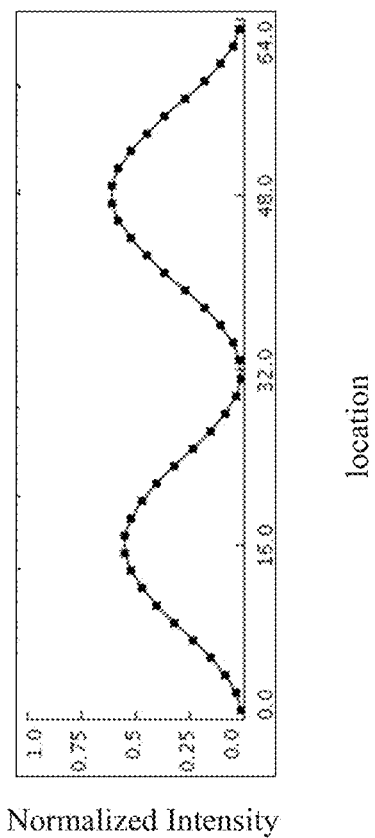

Based on the above, the present disclosure offers the EUV lithography system and process employing an EUV mask having a structure to eliminate 0-th diffracted light ray in a resultant reflected light reflected from the mask. The resultant reflected light contains mainly of −1-st and +1-st diffraction order light. The EUV lithography system and process demonstrates an enhancement of aerial image contrast, image fidelity and quality. As an example, by using the system and the process provided in the present embodiment, an image with a good contrast and quality is achieved, as shown in FIGS. 4A and 4B.

The present disclosure is directed towards lithography systems and processes. In one embodiment, an extreme ultraviolet lithography (EUVL) system includes a mask having first and second reflective regions. The system also includes an illuminator to expose the mask to produce a resultant reflected light form the mask. The resultant reflected light is constructed by a first reflected light reflected from the first reflective region and a second reflected light reflected from the second reflective region. The resultant reflected light contains mainly diffracted light. The system also optics to collect and direct resultant reflected light to expose a target.

In another embodiment, an EUVL process includes receiving a mask. The mask has first and second reflective regions. The process also includes exposing the mask by an illumination to produce a resultant reflected light from the first and the second reflective regions. The resultant reflected light contains almost zero non-diffracted light. The system also includes collecting and directing reflected light from the resultant reflective light by a projection optics box (POB) to expose a target.

The present disclosure is also directed towards masks. In one embodiment, the mask for extreme ultraviolet lithography (EUVL) includes a low thermal expansion material (LTEM) material layer, a reflective multilayer (ML) above one surface of the LTEM material layer. The mask also includes a first and a second reflective region formed over the reflective ML. The first and second reflective regions are configured such that a reflected light from the first reflective region has an about 180 degree phase shift respect to the reflected light from the second reflective region.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask for extreme ultraviolet lithography (EUVL), comprising:
    a low thermal expansion material (LTEM) layer; and
    a reflective multilayer (ML) disposed over the LTEM layer, wherein the reflective ML has a first thickness in a first reflective region and a second thickness in a second reflective region, wherein the second thickness is less than the first thickness; and
    a metal-containing layer disposed over a top surface of the reflective ML in one of the first reflective region or the second reflective region, such that light reflected from the one of the first reflective region or the second reflective region has a phase shift.

2. The mask for EUVL of claim 1, wherein the metal-containing layer includes molybdenum, and the metal-containing layer is disposed over the top surface of the reflective ML in the first reflective region.

3. The mask for EUVL of claim 1, wherein the metal-containing layer is a first metal-containing layer that includes molybdenum, and the first metal-containing layer is disposed over the top surface of the reflective ML in the first reflective region, the mask further comprising:
    a second metal-containing layer disposed over the top surface of the reflective ML in the second reflective region, wherein the second metal-containing layer includes a metal that is different from molybdenum.

4. The mask for EUVL of claim 3, wherein the metal is aluminum or actinium.

5. The mask for EUVL of claim 3, further comprising a third metal-containing layer disposed over the first metal-containing layer, wherein the third metal-containing layer includes the metal.

6. The mask for EUVL of claim 5, wherein the second metal-containing layer and the third metal-containing layer have a same thickness.

7. The mask for EUVL of claim 5, wherein the second metal-containing layer is directly disposed on the top surface of the reflective ML in the second reflective region.

8. The mask for EUVL of claim 3, wherein:
    the first metal-containing layer has a thickness of about 32.53 nm; and
    the second metal-containing layer has a thickness of about 16 nm when the metal is aluminum and a thickness of about 6 nm when the metal is actinium.

9. The mask for EUVL of claim 3, wherein the reflective ML is disposed over a first surface of the LTEM layer, the mask further comprising a conductive layer disposed over a second surface of the LTEM layer, the second surface being opposite the first surface.

10. The mask for EUVL of claim 3, wherein the metal-containing layer includes aluminum, and the metal-containing layer is disposed over the top surface of the reflective ML in the second reflective region.

11. The mask for EUVL of claim 1, further comprising a capping layer disposed over the top surface of the reflective ML in the first reflective region, wherein the second reflective region is free of the capping layer.

12. The mask for EUVL of claim 11, wherein the capping layer includes ruthenium (Ru) or chromium (Cr).

13. A mask for extreme ultraviolet lithography (EUVL), comprising:
a low thermal expansion material (LTEM) layer;
a reflective multilayer (ML) above one surface of the LTEM layer, wherein the reflective ML has a first thickness in a first reflective region and a second thickness in a second reflective region, wherein the second thickness is less than the first thickness;
a first metal-containing layer disposed over the reflective ML in the first reflective region; and
a second metal-containing layer disposed over the reflective ML in the second reflective region, wherein the second metal-containing layer is different from the first metal-containing layer in composition.

14. The mask for EUVL of claim 13, wherein the first and second reflective regions have a phase shift of about 180 degree to an extreme ultraviolet (EUV) radiation from a lithography system that is operable to perform an exposure process to a target using the mask.

15. The mask for EUVL of claim 13, wherein
the second metal layer is directly disposed on the reflective ML in the second reflective region; and
a top surface of the second metal-containing layer in the second reflective region is lower than a top surface of the reflective ML in the first reflective region.

16. The mask for EUVL of claim 13, wherein
the first metal-containing layer in the first reflective region is a molybdenum layer; and
the second metal-containing layer in the second reflective layer is one of an aluminum layer and an actinium layer.

17. The mask for EUVL of claim 13, wherein the first reflective region further includes:
a third metal-containing layer disposed over the first metal-containing layer, wherein the second and third metal-containing layers have a same composition and a same thickness; and
a capping layer interposed between the first metal-containing layer and the reflective ML, wherein the capping layer is a metal-containing layer different from the first and second metal-containing layers in composition.

18. The mask for EUVL of claim 16, wherein:
the molybdenum layer has a thickness of about 32.53 nm;
the aluminum layer has a thickness of about 16 nm; and
the actinium layer has a thickness of about 6 nm.

19. An extreme ultraviolet lithography (EUVL) process, comprising:
receiving a mask having first and second reflective regions, wherein the mask includes:
a low thermal expansion material (LTEM) layer,
a reflective multilayer (ML) disposed over the LTEM layer, wherein the reflective ML has a first thickness in a first reflective region and a second thickness in a second reflective region, wherein the second thickness is different from the first thickness, and
a metal-containing layer disposed over a top surface of the reflective ML in one of the first reflective region or the second reflective region, such that light reflected from the one of the first reflective region or the second reflective region has a phase shift;
exposing the mask by an illumination to produce a resultant reflected light from the first and the second reflective regions, wherein the resultant reflected light includes more diffracted light than non-diffracted light; and
directing the resultant reflective light to expose a target.

20. The EUVL process of claim 19, wherein the directing of the resultant reflective light to expose the target includes collecting and directing the $-1^{st}$ and $+1^{st}$ diffraction order light to expose the target.

* * * * *